United States Patent [19]
Ho et al.

[11] Patent Number: 5,510,615
[45] Date of Patent: Apr. 23, 1996

[54] SCANNING PROBE MICROSCOPE APPARATUS FOR USE IN A SCANNING ELECTRON MICROSCOPE

[75] Inventors: Huddee Ho, San Jose; Paul E. West, Cupertino, both of Calif.

[73] Assignee: Topometrix Corporation, Santa Clara, Calif.

[21] Appl. No.: 478,479

[22] Filed: Jun. 7, 1995

Related U.S. Application Data

[63] Continuation of Ser. No. 273,740, Jul. 12, 1994, Pat. No. 5,455,420.

[51] Int. Cl.[6] ................................................. H01J 37/067
[52] U.S. Cl. ....................... 250/306; 250/442.11
[58] Field of Search ................................. 250/306, 307, 250/440.1, 441.11, 442.11

[56] References Cited

U.S. PATENT DOCUMENTS

| | | | |
|---|---|---|---|
| 4,724,318 | 2/1988 | Binnig | 250/306 |
| 4,798,989 | 1/1989 | Miyazaki et al. | 250/491.1 |
| 4,874,945 | 10/1989 | Ohi | 250/311 |
| 4,948,971 | 8/1990 | Vogen et al. | 250/310 |
| 4,992,660 | 2/1991 | Kobayashi | 250/306 |
| 5,081,353 | 1/1992 | Yamada et al. | 250/491.1 |
| 5,229,607 | 7/1993 | Matsui et al. | 250/306 |
| 5,253,516 | 10/1993 | Elings et al. | 73/105 |
| 5,256,876 | 10/1993 | Hazaki et al. | 250/491.1 |
| 5,260,622 | 11/1993 | West | 310/328 |
| 5,283,442 | 2/1994 | Martin et al. | 250/561 |

OTHER PUBLICATIONS

Hitachi, "S–4100 Hitachi Scanning Tunneling Microscope", pp. 1–22, has no date.
Hitachi, "Hitachi Scanning Tunneling Microscope", pp. 1–10, has no date.

*Primary Examiner*—Jack I. Berman
*Assistant Examiner*—Keit T. Nguyen
*Attorney, Agent, or Firm*—Fulwider Patton Lee & Utecht

[57] ABSTRACT

The scanning probe microscope translation apparatus includes a scanning probe microscope for examining a specimen, with a specimen stage for mounting the specimen for examination by the scanning probe microscope, and a first translator mounted to the scanning probe microscope for translating the specimen stage relative to the scanning probe microscope. A support frame is dimensioned and adapted to be mounted in a specimen chamber of a scanning electron microscope, and a second translator is provided for scanning the scanning probe microscope relative to the support frame. The second translator is mounted on dual mass plates provided for isolating the scanning probe microscope from external vibrations, and suspension device are provided for suspending the mass plates from the support frame. A vacuum load lock system permits moving the scanning probe microscope, specimen stage, first translator, and mounting assembly into and out of the vacuum of the scanning electron microscope vacuum chamber.

24 Claims, 9 Drawing Sheets

SCANNING PROBE MICROSCOPE APPARATUS FOR USE IN A SCANNING ELECTRON MICROSCOPE

This is a continuation of application Ser. No. 08/273,740, filed Jul. 12, 1994, now U.S. Pat. No. 5,455,420.

BACKGROUND OF THE INVENTION

1. Field of the Invention

This invention relates generally to scanning probe microscopes, and more particularly relates to a scanning probe microscope such as an atomic force microscope adapted for use in a specimen chamber of a scanning electron microscope.

2. Description of Related Art

Scanning probe microscopes are useful for imaging objects as small as atoms. Scanning probe microscopy is closely related to scanning tunneling microscopy and the technique of stylus profilometry. However, in a scanning probe microscope, such as an atomic force microscope, a laser beam is typically deflected by a reflective lever arm to which the probe is mounted, indicative of vertical movement of the probe as it follows the contours of a specimen. The deflection of the laser beam is typically monitored by a photodetector in the optical path of the deflected laser beam, and the specimen is mounted on a stage moveable in minute distances in three dimensions. The specimen or probe can be raster scanned while the vertical positioning of the probe relative to the surface of the specimen and the force between the probe and the specimen are maintained substantially constant by a feedback loop with the photodetector controlling the vertical positioning of the specimen.

Scanning probe microscopes, and particularly atomic force microscopes, are useful in examining integrated circuit wafers because the microscope can resolve to atomic dimensions. However, examination of an entire specimen with a scanning probe microscope can be extremely time-consuming and expensive. Scanning electron microscopes can be used more efficiently for scanning an integrated circuit specimen, but they are not capable of imaging the surface of the specimen with the high resolution three-dimensionality of a scanning probe microscope.

Scanning probe microscopes have been utilized in combination with scanning electron microscopes. By positioning the scanning probe microscope within a specimen chamber of a scanning electron microscope, it is possible to generally examine the surface of the specimen with the scanning electron microscope, and to then examine specific areas of interest with higher resolution with the scanning probe microscope. A scanning probe microscope can also be used in different modes, such as to examine electrical and other properties of the specimen. However, there is a need for improved vibration isolation of the scanning probe microscope within the specimen chamber of the scanning electron microscope, because the scanning probe microscope is more sensitive to external vibrations than the scanning electron microscope.

Conventional techniques for utilizing scanning probe microscopes in combination with scanning electron microscopes have also presented the technical difficulty of adjusting positions and interchanging items such as the sample, or the probe and laser of the scanning probe microscopes, and the like, once the scanning probe microscope was sealed within the evacuated scanning electron microscope. The most common and simplest approach to providing such access involves breaking the vacuum in the scanning electron microscope chamber, and removing the entire scanning probe microscope system, which requires the rather lengthy and tedious process of recreating a full vacuum within the scanning electron microscope chamber once the adjustments to the scanning probe microscope have been made. Another approach to providing access to the scanning probe microscope has involved manipulating the items to be changed or adjusted within the scanning electron microscope vacuum chamber by remote control within the full vacuum in the vacuum chamber, although this is typically not entirely satisfactory due to the difficulty of providing for remote control of every possible contingency. Although scanning probe microscopes have been used within ultra high vacuum chambers equipped with a vacuum interlock, such scanning probe microscopes are commonly permanently mounted in the chamber, while individual elements such as samples and probes are capable of being exchanged through the vacuum interlock. It would be desirable to provide for an apparatus and method of inserting and removing the scanning probe microscope, sample, scanner, and mounting assembly without breaking the vacuum within the scanning electron microscope vacuum chamber.

It would also be desirable to provide a modular scanning probe microscope combination scanner and cantilever probe assembly than can be readily and easily removed and replaced from the scanning probe microscope, to facilitate interchange of such parts with other modular scanning heads, such as a scanning tunnelling microscope head or a scanning thermal head, for example. It would also be desirable to provide an external docking station for the scanning probe microscope of the invention, to allow the scanning probe microscope to also be used independently of the scanning electron microscope. The present invention meets these needs.

SUMMARY OF THE INVENTION

Briefly, and in general terms, the present invention provides for a scanning probe microscope translation apparatus with improved accessibility for use in combination with a scanning electron microscope, and improved vibration isolation. Improved accessibility is achieved principally by provision of a vacuum load lock module, with which the scanning probe microscope, sample, scanner, and mounting assembly can be inserted and removed from the fully evacuated scanning electron microscope vacuum chamber. Improved vibration isolation is achieved by an assembly of dual mass plates suspended by a plurality of o-rings from a frame assembly to be mounted to a specimen chamber of the scanning electron microscope.

Accordingly, the present invention provides for a scanning probe microscope translation apparatus for use with a scanning electron microscope. The apparatus comprises a scanning probe microscope having a probe for examining a specimen, with a specimen stage for mounting the specimen for examination by the scanning probe microscope, means for scanning the probe relative to the specimen, and a first translating means upon which the specimen stage is mounted for translating the specimen stage relative to the scanning probe microscope. The apparatus includes a cover plate for sealing an access opening of the scanning electron microscope specimen vacuum chamber, the cover plate including a sealable opening therethrough, a support frame mounted to the inside surface of the cover plate for mounting in the specimen vacuum chamber. The scanning probe microscope and first translating means are disposed on a second translating means for translating the scanning probe microscope and specimen stage relative to the scanning electron microscope. A mounting assembly is provided for mounting the scanning probe microscope, the first translating means, and the specimen stage on the second translating means, and for moving them as a group with respect to the scanning electron microscope. Vacuum load lock means are advantageously disposed on the outside surface of the cover plate for moving the mounting assembly, the scanning probe microscope, the specimen, and the first translating means as a unit through the sealable opening of the cover plate between a first position disposed within the support frame and a second position disposed in the load lock means without breaking the vacuum in the vacuum chamber, which is particularly useful when a vacuum has been created in the vacuum chamber, and needs to be maintained. The vacuum load lock system preferably includes a gate valve moveable between open and closed positions, and means for operating the gate valve. The vacuum load lock system also includes a vacuum valve switchable between a first position providing a source of vacuum to the load lock module, a second position for venting the load lock module to the atmosphere, and a third position isolating the load lock module from the source of vacuum and the atmosphere. Means are provided for slidably moving the scanning probe microscope, specimen stage, first translating means, and mounting assembly as a unit between the support frame disposed in the scanning electron microscope vacuum chamber, and the vacuum load lock module external to the scanning electron microscope vacuum chamber through the load lock gate valve.

The second translating means is preferably mounted on mass plate means for isolating the scanning probe microscope from external vibrations. The apparatus also includes suspension means for suspending the mass plate means from the support frame. The suspension means preferably comprises a plurality of o-rings connecting the bottom mass plate and the support frame. In a presently preferred embodiment, the mass plate means comprises a top mass plate, a bottom mass plate, and support means for supporting the top mass plate on the bottom mass plate. The top mass plate typically includes a well in which the second translating means is mounted, and the bottom mass plate similarly includes a well in which a portion of the top mass plate is suspended. First positioning means are provided for positioning and aligning the scanning probe microscope relative to the surface of the specimen stage. Second positioning means are provided for aligning and positioning the top mass plate relative to the bottom mass plate. Third positioning means are provided for aligning and positioning the mass plate means relative to the support frame.

Clamping means are also preferably provided for clamping the mass plate assembly in the support frame within the vacuum chamber during high resolution scanning during electron or probe microscopy. The scanning probe microscope can also include a modular, combination scanning probe microscope scanner and probe head, such as a cantilever probe head for atomic force microscopy or a scanning tunnelling probe head for scanning tunnelling microscopy, to provide improved accessibility to, and interchangeability of, the scanning head of the scanning probe microscope.

These and other aspects and advantages of the invention will become apparent from the following detailed description, and the accompanying drawings, which illustrate by way of example the features of the invention.

BRIEF DESCRIPTION OF THE DRAWINGS

FIG. 13a is a bottom plan view of the atomic force microscope modular probe head assembly of FIG. 12a;

FIG. 14 is a bottom plan view of the cantilever probe assembly of the modular probe head assembly of FIG. 13a.

DETAILED DESCRIPTION OF THE PREFERRED EMBODIMENTS

Examination of the entire surface of an integrated chip specimen with a scanning probe microscope can be time-consuming and expensive, while scanning electron microscopes typically used for this purpose do not offer resolution down to atomic dimensions, as is possible with a scanning probe microscope. However, in order to effectively utilize a scanning probe microscope in a scanning electron microscope to use both microscopes to examine a specimen, positioning the scanning probe microscope within a specimen chamber of a scanning electron microscope requires vibration isolation of the scanning probe microscope. Since it is also important to maintain a vacuum within a scanning electron microscope vacuum chamber in order to avoid unnecessary down time, a system is also needed for inserting and removing the scanning probe, specimen and mounting assembly within the vacuum chamber without breaking the vacuum in the vacuum chamber.

Figure 1:
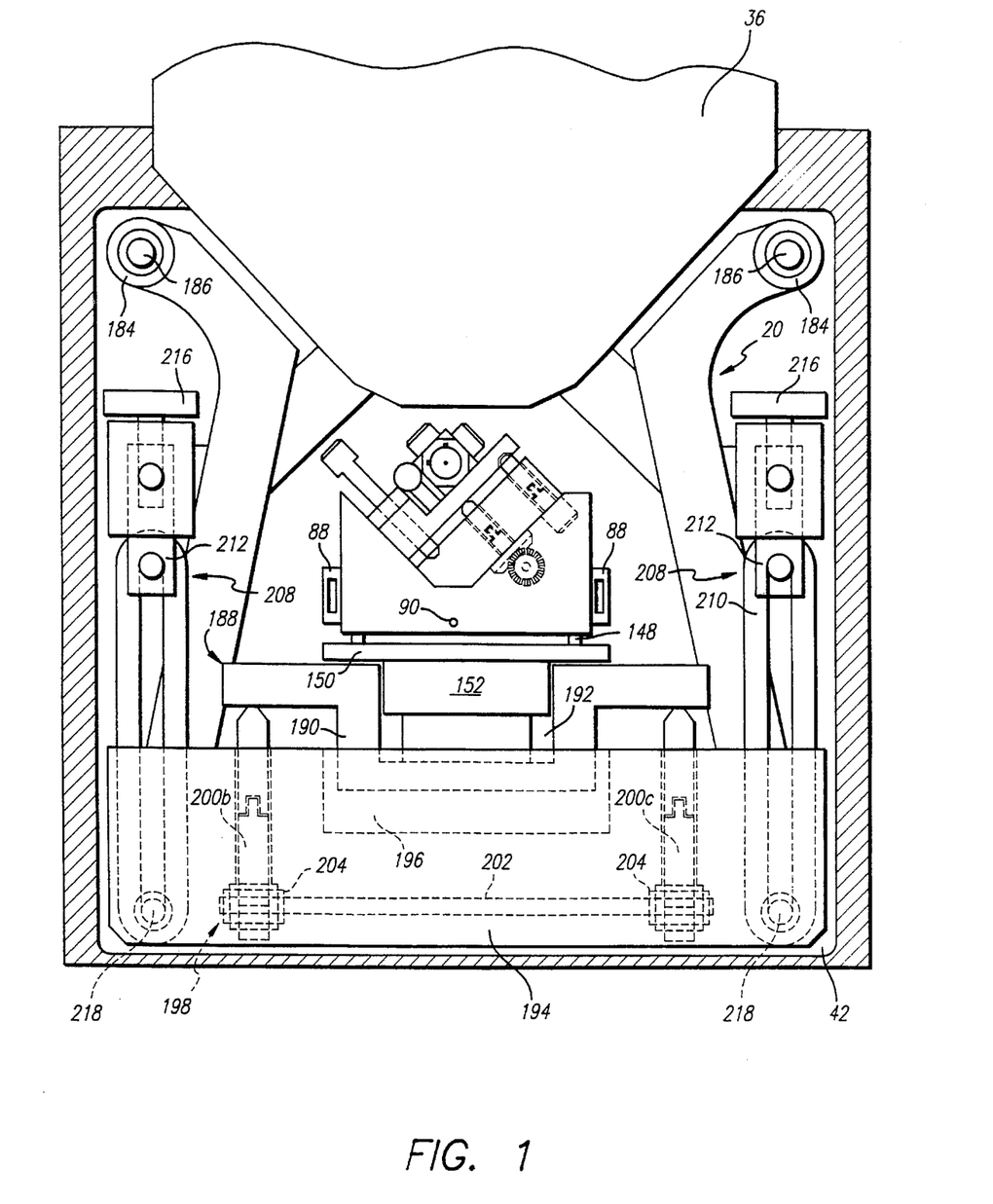
FIG. 1 is a front elevational view of a scanning probe microscope apparatus according to the principles of the invention.
Figure 2:
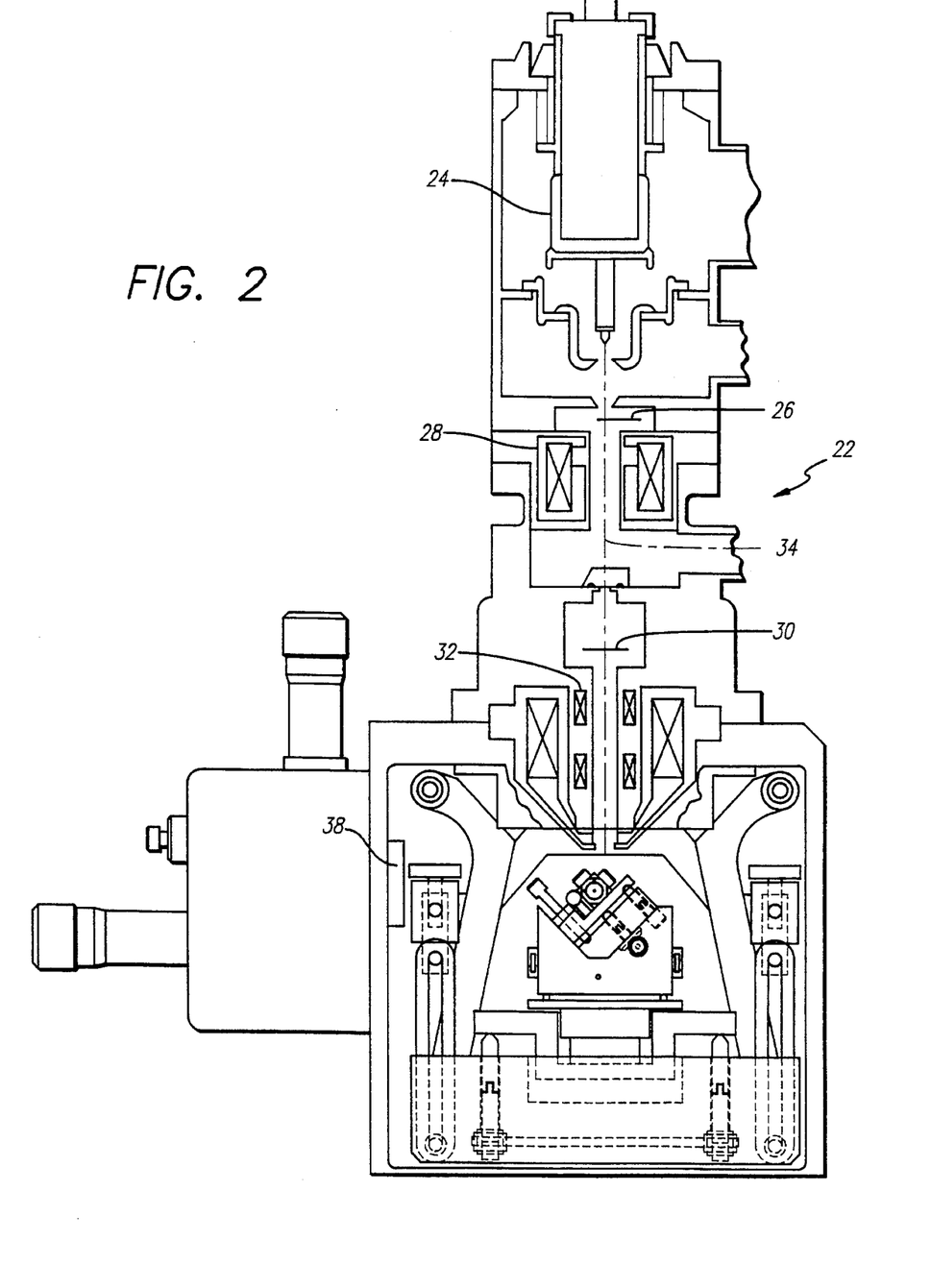
FIG. 2 is a sectional view showing the scanning probe microscope apparatus of FIG. 1 mounted in a specimen chamber of a scanning electron microscope.
Figure 7:
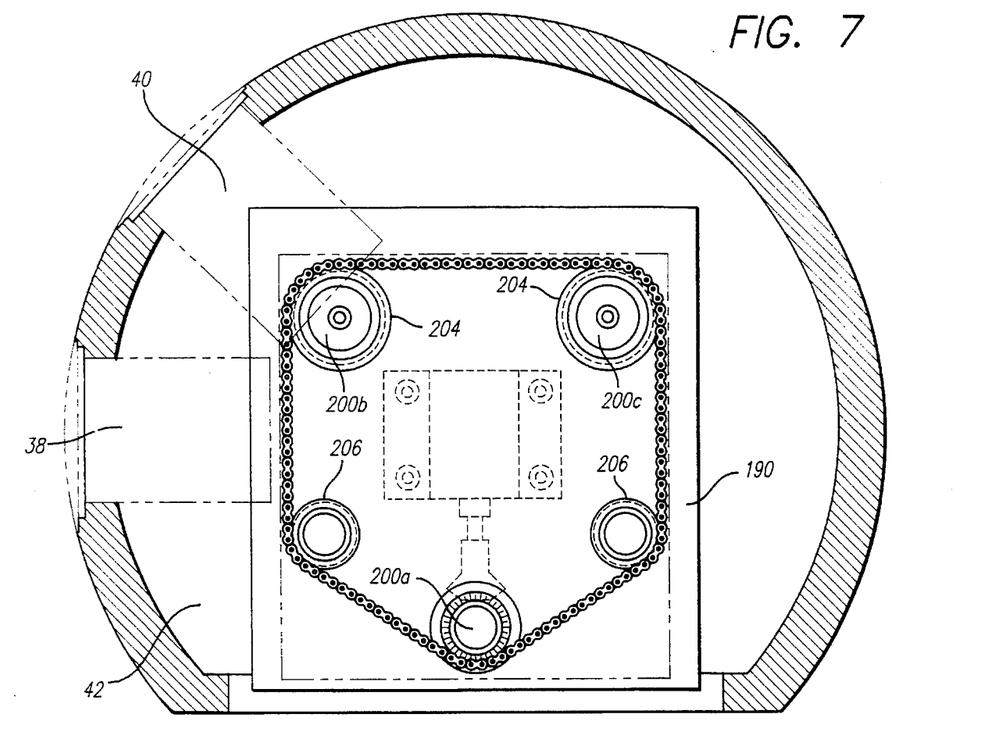
FIG. 7 is a top cutaway view showing the chain drive mechanism of the second positioning means.

Accordingly, as is illustrated in the drawings, the invention is embodied in a scanning probe microscope apparatus 20 for use with a scanning electron microscope 22. As is illustrated in FIGS. 1 and 2, the scanning electron microscope typically includes an electron gun 24, a beam monitor aperture 26, a condensor lens 28, an objective movable aperture 30, and deflection coils 32 for guiding an electron beam 34 through the objective lens 36 of the scanning electron microscope. The electron beam is directed at the specimen, typically mounted at about a 45° angle with respect to the incoming electron beam, which is deflected by the specimen at about a 90° angle to an electron beam detector 38. As is illustrated in FIG. 7, the scanning electron microscope can also include an x-ray detector 40. While mounting of the specimen at about a 45° angle typically maximizes the deflection of the electron beam to the electron beam detector, other mounting angles may also be suitable for providing an optimum viewing angle and/or deflection of the electron beam. The specimen is preferably mounted along with the scanning probe microscope in the specimen vacuum chamber 42 of the electron microscope.

Figure 3:
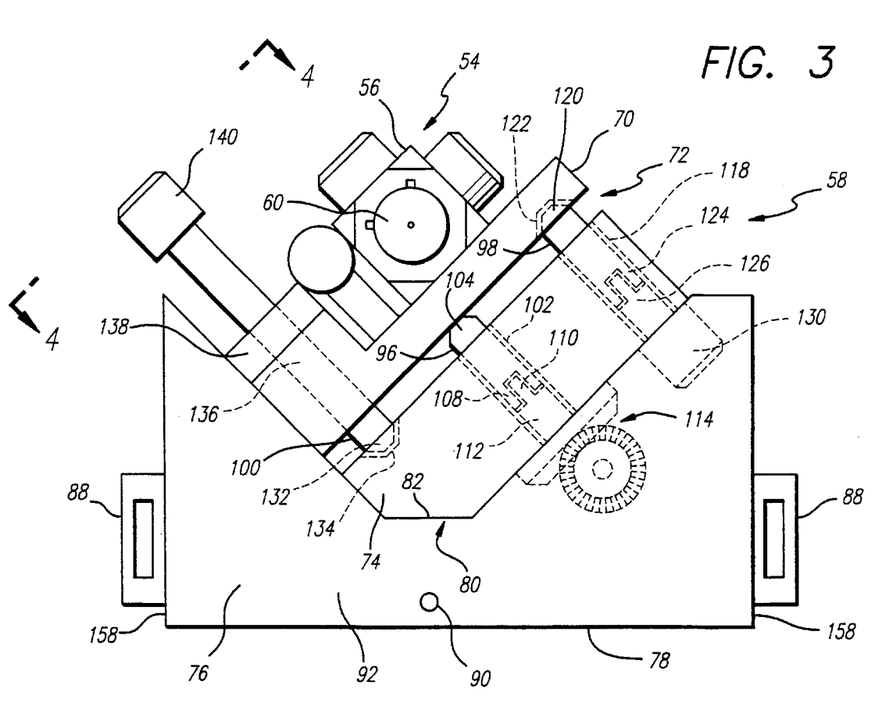
FIG. 3 is a front elevational view of the scanning probe microscope of FIG. 1 removed from the frame assembly and mass plates.
Figure 4:
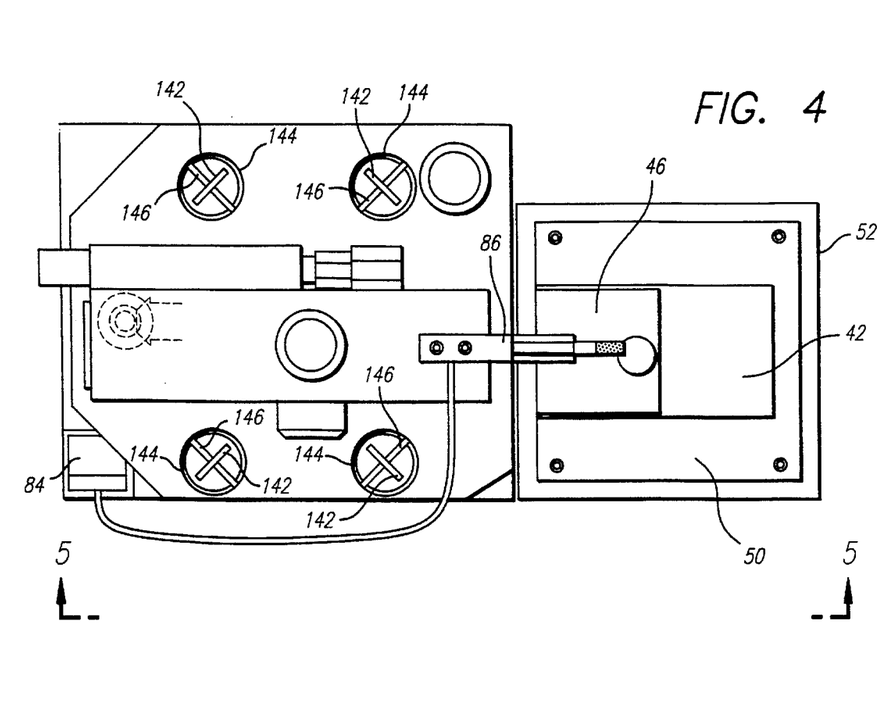
FIG. 4 is a top plan view of the scanning probe microscope taken along line 4—4 of FIG. 3.
Figure 5:
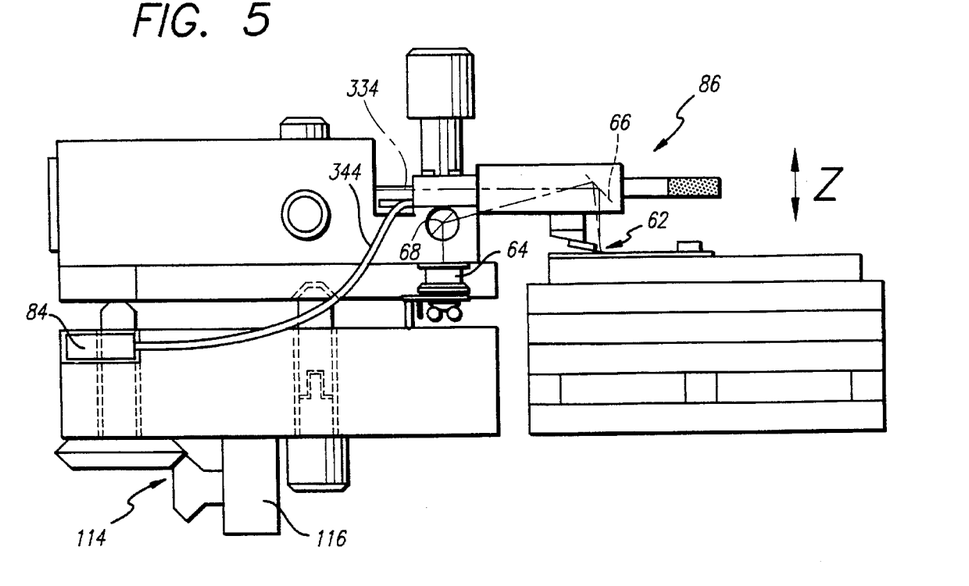
FIG. 5. is a side elevational view of the scanning probe microscope taken along line 5—5 of FIG. 4.

With reference to FIGS. 3, 4 and 5, a specimen can be mounted on a modular, removable plate 46 that rests within a recess 48 of the specimen stage 50, mounted by screws or bolts to a first translating means 52, which will be described further below. The scanning probe microscope 54 typically includes a housing 56 secured by screws or bolts to a mounting assembly 58, and contains a laser source 60. The laser source directs a laser beam at a reflective cantilever arm 62, as will be further described hereinbelow, to which the probe (not shown) is mounted. The laser beam typically has an optical path directed at the reflective cantilever arm, which deflects the laser beam as the probe follows the surface of the specimen. The deflection of the laser beam by the cantilever arm is monitored by a photodetector 64 in the optical path of the deflected laser beam. The optical paths to and from the reflective cantilever arm may include one or more mirrors 66, 68.

Referring to FIGS. 1, 3, 4 and 5, the mounting assembly 58 includes an upper base block 70 to which the housing of the scanning probe microscope is secured, typically by screws or bolts. The upper base block is substantially supported by a first positioning means 72, for positioning the scanning probe microscope in the z dimension relative to the surface of the specimen stage, and for aligning the scanning probe microscope at the selected mounting angle, such as typically about 45 degrees relative to the incoming electron beam of the scanning electron microscope. The first positioning means extends between the upper base block and a lower base block 74 to which the upper base block is connected, as will be described further below. The lower base block is supported by a mounting cradle 76 of the mounting assembly for aligning the scanning probe microscope at the selected mounting angle.

The mounting cradle preferably includes a flat lower base portion 78 and an upper generally trapezoidal, syncline or V-shaped notched portion 80 having an upper surface indented to provide side surfaces forming about a 90° angle, for cradling the lower base block at the selected mounting angle. The lower base block preferably has a bottom corner 82 having a corresponding shape that fits into the notch of the mounting cradle. The lower base block preferably includes an electrical coupling 84 to be connected to the scanning means and probe of the scanning probe head module 86, which will be further described hereinbelow. The electrical coupling 84 is in electrical communication with pairs of electrical couplings 88 on the front and rear sides of the mounting cradle, to be electrically coupled to control electronics (not shown) of the scanning probe microscope apparatus, as will also be further explained hereinbelow.

The mounting cradle also preferably includes a threaded aperture 90 at the front end 92, to permit attachment of an extraction rod 94 to allow the mounting assembly, scanning probe microscope, first translating means and the specimen stage (hereinafter referred to as the SPM group) to be moved between the scanning electron microscope vacuum chamber and the vacuum load lock module, as will be further explained below.

With reference to FIGS. 1, 3, 4 and 5, the first positioning means of the scanning probe microscope mounting assembly preferably includes three threaded screw adjusters 96, 98, and 100, supporting the upper base block. The front end screw drive adjuster 96 extends through a threaded opening 102 in the lower base block, and typically has a rounded end 104 upon which the upper base block rests. A slotted end 108 of the front end screw drive adjuster is slidably linked to a corresponding tongue end 110 of an intermediate shaft 112 and gears 114 to a motor drive 116 mounted below the lower base block. The motor drive is preferably connected to appropriate external electronic controls (not shown). The side threaded screw drive adjuster 98 also extends through a threaded opening 118 in the lower base block, and typically has a rounded end 120 upon which a seat 122 of the upper base block rests. A slotted end 124 of the side threaded screw drive is slidably linked to a corresponding tongue end of an intermediate shaft 126 to a side knob 130 also extending below the lower base block. The top threaded screw adjuster 100 also has a rounded end 132 which rests upon a seat 134 on the lower base block, and includes a shaft 136 threadably connected to a mounting bracket 138 on the upper base block. The top threaded screw adjuster is also manually driven by a knob 140, although both the top and side threaded screw adjuster can also be motor driven.

The upper base block and lower base block are also connected, typically by four tension spring suspenders 142, which are currently preferably steel coil springs extending through apertures 144, for positively securing and biasing the upper base block to the lower base block. The tension spring suspenders may alternatively be 0-ring suspenders, and the like, for positively biasing the upper and lower base blocks together. The tension spring suspenders are mounted to the upper base block by upper cross-pin supports 146, and are secured to the lower base block by lower retainers (not shown), similar to the upper cross-pin supports.

The first translating means of the scanning probe microscope is mounted on the mounting cradle, such as by bolts or screws, for positioning and translating a specimen stage at the selected angle with respect to the scanning electron microscope and electron beam, and for translating the specimen stage relative to the probe of the scanning probe microscope. The first translating means preferably comprises a high resolution stage translator with a removable top specimen stage portion, mounted to the translator by bolts or screws, to allow different types of stages for a variety of specimens to be readily mounted to the translator. The translator is preferably of the type disclosed in U.S. Pat. No. 5,260,622, incorporated herein by reference, although other types of translators and scanning devices, such as a standard piezoelectric tube scanner, may also be suitable.

With reference to FIG. 1, 6, 10 and 11, the mounting cradle is preferably slidably disposed on a pair of tracks 148, that are preferably formed of a low friction material, such as tetrafluoroethylene, also available under the trademark "TEFLON" from DuPont. The tracks are typically mounted, such as by screws or bolts, on top of a plate 150, that is in turn mounted, similarly by screws or bolts, to a second translating means 152, for translating the entire SPM group relative to the scanning electron microscope. The second translating means is preferably a piezoelectric tube scanner, although other types of similar scanning devices well known in the art may also be suitable.

Figure 11:
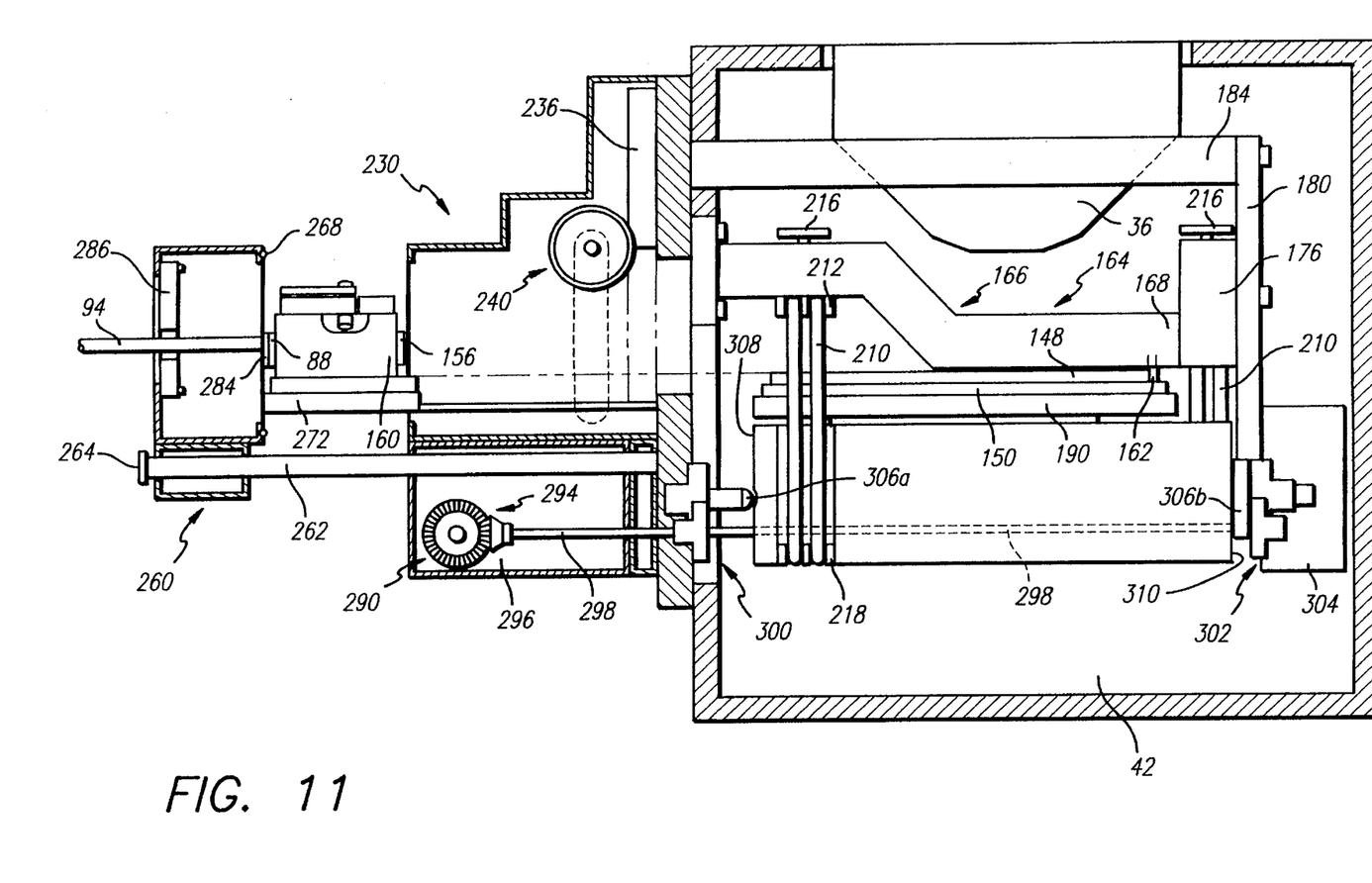
FIG. 11 is a partial sectional elevational view of the vacuum load lock module and support frame of the scanning probe microscope apparatus with the vacuum load lock module opened, showing the scanning probe microscope, specimen stage, first translating means, and mounting assembly withdrawn from the scanning electron microscope through the vacuum load lock module.

Referring to FIGS. 1, 3 and 11, the front pair of electrical couplings 88, and a rear pair of electrical couplings 156, both electrically connected to the first positioning means and the scanning probe microscope coupling, are secured to the ends of the mounting cradle adjacent the front and rear side edges 158, 160 of the mounting cradle, respectively. The rear coupling pair 156 is adapted to be electrically connected to a corresponding rear base pair of couplings 162 mounted on the plate of the second translating means. The rear base pair of couplings are in turn connected to an external control unit (not shown).

Figure 6:
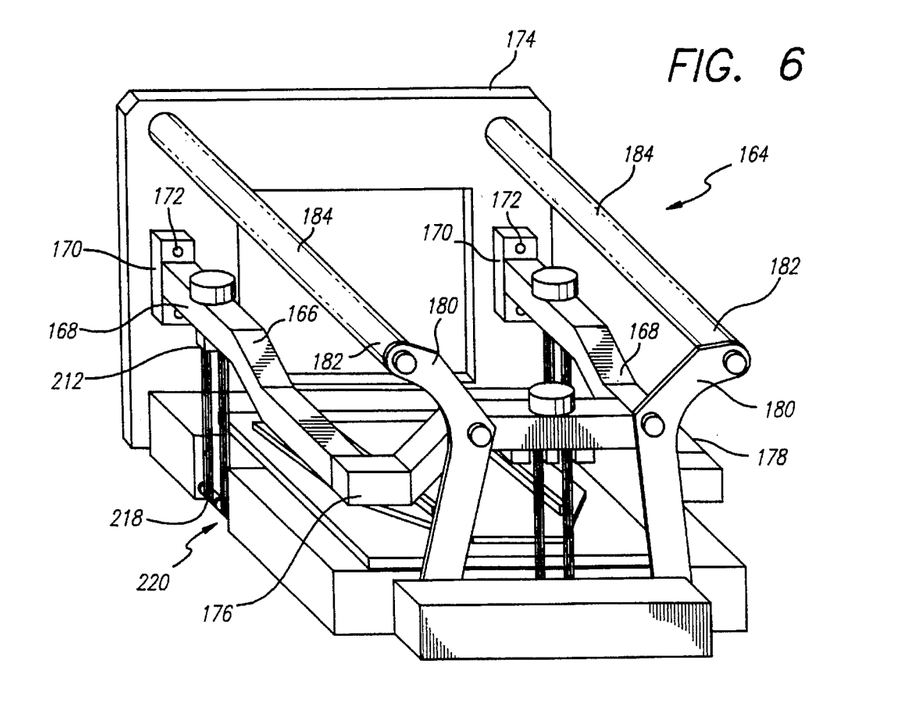
FIG. 6 is a rear perspective view of the frame assembly of FIG. 1 with the scanning probe microscope removed, mounted to a cover plate of the specimen chamber of the electron microscope.

As is illustrated in FIGS. 1, 6, 10 and 11, the scanning probe microscope apparatus includes a support frame 164, shown in FIG. 6 with the scanning probe microscope assembly removed, so that the tracks are visible on top of the plate. The support frame is dimensioned and designed to be mounted in the vacuum specimen chamber of the scanning electron microscope, as illustrated in FIG. 1. The support frame currently typically includes a lower, generally u-shaped frame portion 166 having two lower arm members 168 including flanges 170 with bolt holes 172 at a front end of the arm members for mounting the lower arm members to a cover plate 174 of the vacuum chamber of the scanning electron microscope, by bolts or screws, and an outer transverse brace 176 secured to the opposite, or rear end 178 of the arm members, such as by welding, bolts or screws. Two upright legs 180 are secured to the top of the outer transverse brace, such as by bolts, screws, or welding, and are in turn secured to the outer or rear ends 182 of a pair of upper arm members 184 by bolts or screws. The upper arm members have end bolt holes 186 at their front ends, for securing the upper arm members to the cover plate by bolts (not shown).

As can best be seen in FIGS. 1 and 6, the SPM group is preferably supported by a mass plate assembly 188 suspended from the support frame, for isolating the scanning probe microscope from external vibrations which might otherwise be transmitted through the scanning electron microscope. The mass plate assembly preferably includes a top mass plate 190 having a well 192 in which the second translating means is mounted, as by bolts or screws, and a bottom mass plate 194 having a well 196 in which the well of the top mass plate is suspended.

As is shown in FIGS. 1 and 7, the top mass plate preferably is supported by a second positioning means 198 for aligning and positioning the top mass plate relative to the bottom mass plate. The second positioning means preferably comprises one actively motor-driven threaded master positioning screw 200a and two or more other passive threaded slave positioning screws 200b and c disposed underneath the top mass plate. The slave positioning screws are preferably split slotted and tongue end screws like those in the first positioning means described above, with the top slotted portion of the slave screw threaded in the bottom mass plate. The two slave positioning screws 200b and c are commonly driven by the master drive screw by a chain 202. Each threaded screw preferably includes a sprocket 204 to engage and cooperate with the chain, so that rotation of the master drive screw causes all of the slave positioning screws to be commonly and synchronously raised or lowered, as desired. Tensioning chain guides 206 are also preferably provided for maintaining the chain drive taut. The top and bottom mass plates are preferably made of a heavy metal, such as steel, and together typically weigh approximately 70 pounds (about 32 kg). The heavy dual mass plates help keep the scanning probe microscope and stage steady, and absorb external vibrations which may be transmitted through the o-ring suspension assemblies.

As is illustrated in FIGS. 1, 2 and 6, the mass plate assembly is currently preferably suspended from the support frame by three o-ring suspension assemblies 208. Each o-ring suspension assembly preferably includes at least one, and preferably a pair, of elastomeric o-rings 210 attached and suspended at their upper ends from an o-ring support bar 212 secured to the u-shaped frame portion by a threaded screw adjuster 216. The o-rings are similarly attached and retained at their lower end by a lower o-ring retainer bar 218 mounted in a slot 220 in the lower mass plate. A threaded screw adjuster 216 is provided for each o-ring suspension assembly, extending through the lower arm members of the support frame. The three threaded screw adjusters 216 are connected to and support the upper o-ring support bars 212, for raising and lowering each o-ring suspension assembly, and together provide a third positioning means for positioning and aligning the mass plate means relative to the support frame.

Referring to FIGS. 8–11, the scanning probe microscope apparatus includes a vacuum load lock module 230 for inserting and removing the SPM group as a unit into and out of the vacuum of the scanning electron microscope vacuum chamber. The vacuum load lock module preferably comprises a module housing 232, and a stage lock 234 including a gate valve 236 moveable between an open position in which the gate valve is raised above the access port 238 through the cover plate, and a closed position, in which the gate valve is lowered to seal the access port through the cover plate. The stage lock also includes means 240 for moving the gate valve between these two positions, and currently typically comprises a rack and pinion system operated by the external lever 242 on the outside of the load lock chamber 244.

Figure 8:
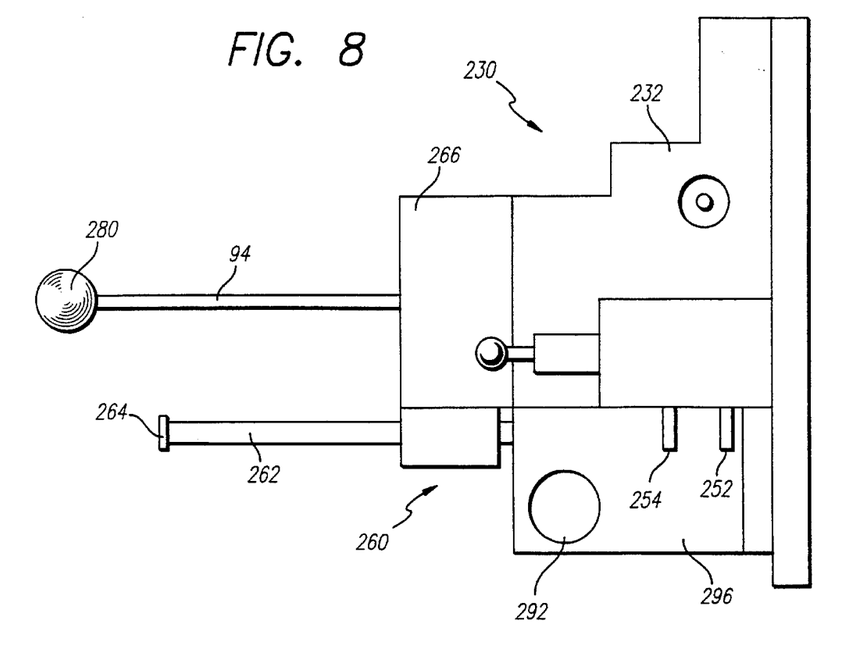
FIG. 8 is a side elevational view of the vacuum load lock chamber of the scanning probe microscope apparatus according to the invention.
Figure 9:
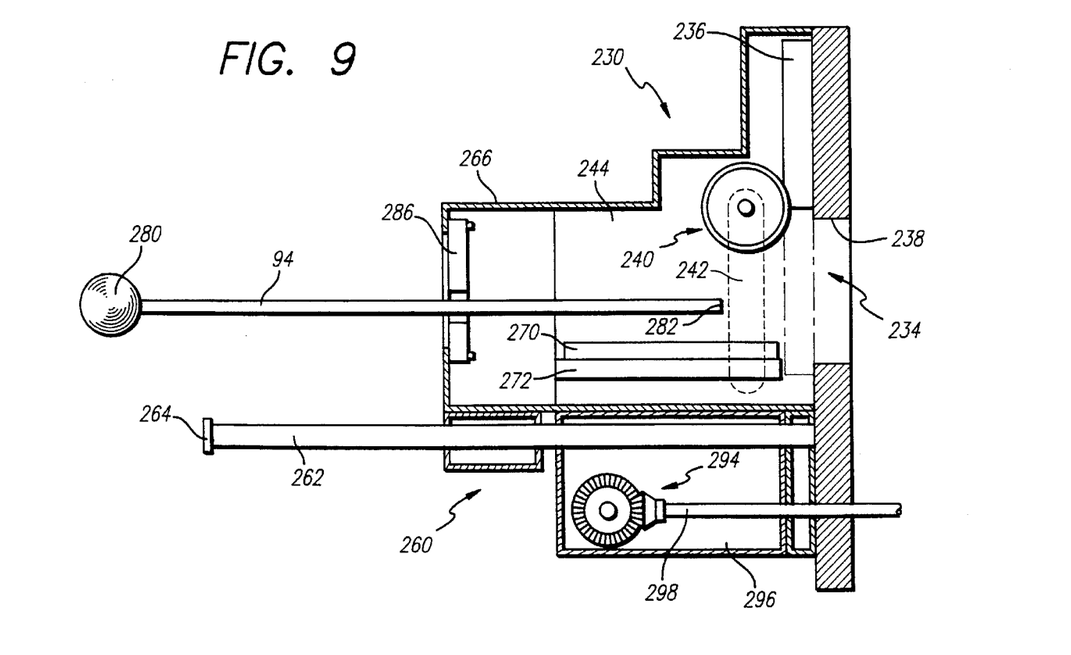
FIG. 9 is an elevational cross-sectional view of the vacuum load lock chamber of FIG. 8.

Referring to FIG. 8, in order to equalize the pressure in the load lock chamber with the vacuum in the scanning electron microscope vacuum chamber, a vacuum valve 250 is provided, switchable between a first position connecting a vacuum inlet 252 with a source of vacuum (not shown) to the load lock chamber, a second position connecting the load lock chamber with the vent port 254 to the atmosphere, for bringing the load lock chamber to atmospheric pressure, so that the load lock chamber can be opened for access to the scanning probe microscope, and a third position isolating the load lock chamber from the source of vacuum and the atmosphere.

Figure 10:
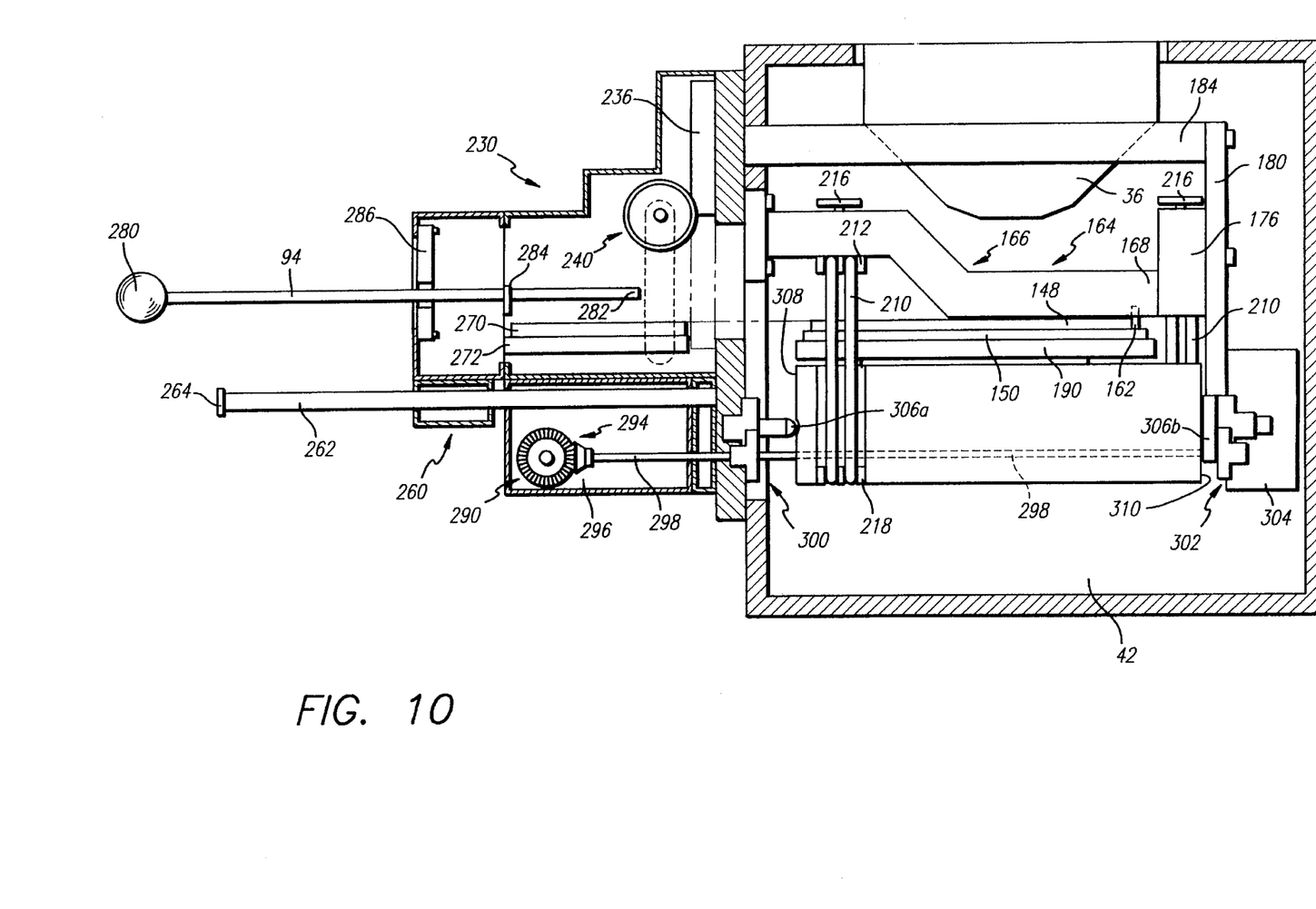
FIG. 10 is a partial sectional elevational view of the vacuum load lock chamber and support frame of the scanning probe microscope apparatus for use in a scanning electron microscope, with the scanning probe microscope, specimen stage, first translating means, and mounting assembly removed for simplicity, and showing the clamping mechanism of the scanning probe microscope apparatus of the invention.

The vacuum load lock module is currently secured to the cover plate by bolts or screws, and sealed with an o-ring seal, although the vacuum load lock module can also be secured to the cover plate by welding. The vacuum load lock module 230 also preferably includes a base portion 260, which currently preferably includes two rods enclosed in tubes 262 interconnected at their front end by a cross-bar 264. The vacuum load lock module chamber includes a front section 266 separable from the module housing that includes tubular apertures receiving and riding on the two base rods to allow the separable front section to be slidably moved between an open position providing access to the interior of the vacuum load lock chamber, and a closed, sealed position. Referring to FIGS. 10 and 11, in the closed position, the separable front section is sealed to the housing 232 of the load lock chamber when a vacuum is created in the load lock chamber by an o-ring seal 268 on the load lock chamber housing.

Another pair of low friction tracks 270 is also preferably provided on a base plate 272 in the load lock module housing, aligned with the tracks on the second positioning means, for slidably moving the SPM group between the support frame of the apparatus, disposed in the scanning electron microscope vacuum chamber, and the vacuum load lock module external to the scanning electron microscope vacuum chamber through the load lock gate valve. The load lock module tracks are also preferably made of tetrafluoroethylene, although other low friction materials well known in the art may also be suitable.

The extraction rod 94 preferably includes a handle 280 at the front end and a threaded rear end 282, and is mounted in the separable front section, aligned for receipt in the threaded aperture 90 in the front end of the mounting cradle. The extraction rod is mounted in the separable front section in a sealed valve allowing the rod to be slidably extended through the gate valve to be attached to the mounting cradle, for moving the SPM group between the vacuum chamber of the scanning electron microscope and the vacuum load lock module. Once the mounting cradle is withdrawn from the vacuum chamber, the electrical couplings on the front end of the mounting cradle can be coupled with corresponding electrical couplings 284 in the separable front section of the vacuum load lock module, for operation of the scanning probe microscope in the load lock module. When the mounting cradle is returned to the vacuum chamber of the scanning electron microscope, the rear electrical couplings on the mounting cradle are similarly connected to corresponding couplings on the support frame, and the rod 82 can be detached from the mounting cradle and retracted through the gate valve. The separable front section of the load lock module also preferably includes a window 286, through which an operator can view the docking of the mounting cradle in both the support frame and the load lock module.

With reference to FIGS. 8–11, clamping means 290 are also preferably provided for clamping the mass plate assembly in the support frame within the scanning electron microscope vacuum chamber during high resolution scanning-during scanning of the specimen by electron or probe microscopy. In one currently preferred embodiment, the clamping means includes a clamp control knob 292, typically located on a lower portion of the load lock module housing, connected through a miter bevel gear drive arrangement 294 in a gear box 296 in the load lock module housing to a drive shaft 298 extending through the load lock module, the cover plate, and through or under the bottom mass plate to a front gear assembly 300 and to a rear gear assembly 302 in the rear gear box 304 mounted to the rear end of the support frame. The front and rear gear assemblies connected to the drive shaft are arranged to drive a miter bevel gear for driving a front threaded ball end clamp 306a, and a rear left hand or reverse threaded flat face clamp 306b, to simultaneously press against a front and rear sides 308, 310, respectively, of the lower mass plate. The clamping mechanism thus allows the extraction rod to be attached to the mounting cradle, and allows the SPM group to be slidably moved between the vacuum chamber and the load lock module, without disturbing the mass plate vibration isolation system. Conversely, when the SPM group is inserted in the vacuum chamber and the extraction rod is withdrawn for use of the scanning probe microscope within the scanning electron microscope, the clamp mechanism can be released by turning the front clamp control knob.

Referring to FIGS. 4, 5, 12a, 12b, 13a, 13b and 14, a modular, combination scanning probe microscope scanner and probe head assembly 86 is also preferably provided for improved accessibility to, and interchangeability of, the scanning head of the scanning probe microscope. The probe head assembly preferably includes a knurled handle 322 extending from the rear end 324 of the body 326 of the probe head assembly, and preferably includes a first mounting pin 328 and a second mounting pin 330 extending from the front end 332 of the body 326 of the probe head assembly. The first mounting pin 328 is rotatably received in a corresponding mounting aperture 334 in the top of the scanning probe microscope body 54, and the second mounting pin is received in a probe head spring clip (not shown) adjacent to the mounting aperture 334 in the top of the scanning probe microscope body, allowing the probe head assembly to be mounted to the body of the scanning probe microscope by first inserting the first mounting pin in the mounting aperture, and rotating the probe head assembly until the second mounting pin snaps into place in the probe head spring clip.

Figure 12A:
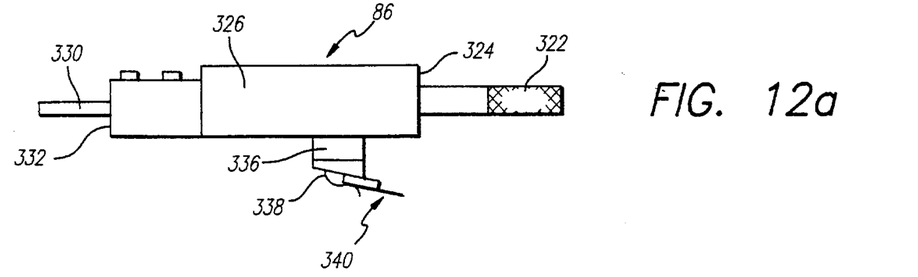
FIG. 12a is an enlarged elevational view of an atomic force microscope modular probe head assembly for use with the scanning probe microscope apparatus of the invention.
Figure 13A:
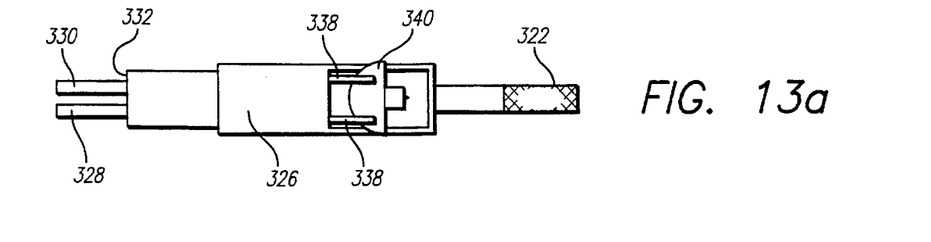
Figure 14:
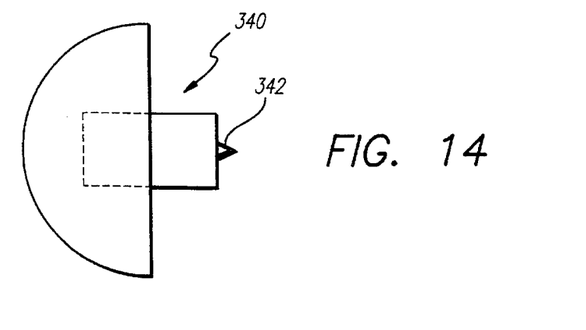

The body of the probe head assembly also preferably includes scanning means such as a tube scanner 336 mounted to the body of the probe head assembly by epoxy adhesive, for example. For an atomic force microscope probe, as illustrated in FIGS. 12a, 13a and 14, a cantilever spring clip 338 is mounted to the tube scanner, also by epoxy adhesive, for example, for removably receiving a cantilever assembly 340 bearing a reflective cantilever member 342 bearing the probe (not shown) of the scanning probe microscope. The tube scanner 336 is electrically connected by electrical connectors 344 to the scanning probe microscope electrical coupling 84, described above, allowing the tube scanner to be operated for fine positioning of the cantilever and probe head for raster scanning the probe head relative to the specimen, although it is alternatively possible to similarly scan the specimen with respect to the probe.

Figure 12B:
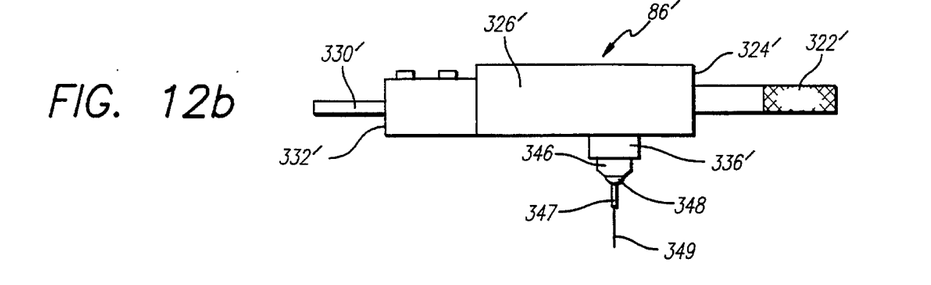
FIG. 12b is an enlarged elevational view of a scanning tunnelling microscope modular probe head assembly for use with the scanning probe microscope apparatus of the invention.
Figure 13B:
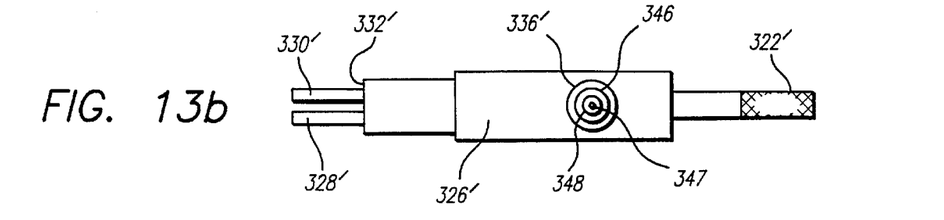
FIG. 13b is a bottom plan view of the scanning tunnelling microscope modular probe head assembly of FIG. 12b.

With reference to FIGS. 12b and 13b, an alternative modular, combination scanning probe microscope scanner and scanning tunnelling microscope (STM) probe head assembly 86', substantially similar to the probe head assembly of FIGS. 12a, 13a and 14, can also be provided for scanning tunnelling microscopy. The STM probe head assembly also preferably includes a knurled handle 322' extending from the rear end 324' of the body 326' of the probe head assembly, a first mounting pin 328' and second mounting pin 330' extending from the front end 332' of the body 326' of the probe head assembly. The first mounting pin 328' is rotatably received in a corresponding mounting aperture 334 in the top of the scanning probe microscope housing 56, and the second mounting pin is received in a probe head spring clip (not shown) adjacent to the mounting aperture 334 in the top of the scanning probe microscope body 56. The body of the probe head assembly 86' also preferably includes scanning means such as a tube scanner 336' that can be mounted to the body of the probe head assembly by epoxy adhesive. The tube scanner 336' is electrically connected by electrical connectors to the scanning probe microscope electrical coupling 84, described above, allowing the tube scanner to be operated for fine positioning of the STM probe head for raster scanning the probe head relative to the specimen, although it is alternatively possible to similarly scan the specimen with respect to the probe. The STM probe structure includes shielding 346 protecting an interior piezoceramic (not shown) for vertically positioning the STM tip in relation to the specimen. A hollow hypo tube 347, such as a stainless steel hypo tube, is attached to the shield 346 by epoxy adhesive 348, for example, and is typically slightly curved for receiving and retaining a STM needle tip 349, formed from tungsten for example, that is inserted into the hollow of the hypo tube and retained by an interference fit.

Figure 15:
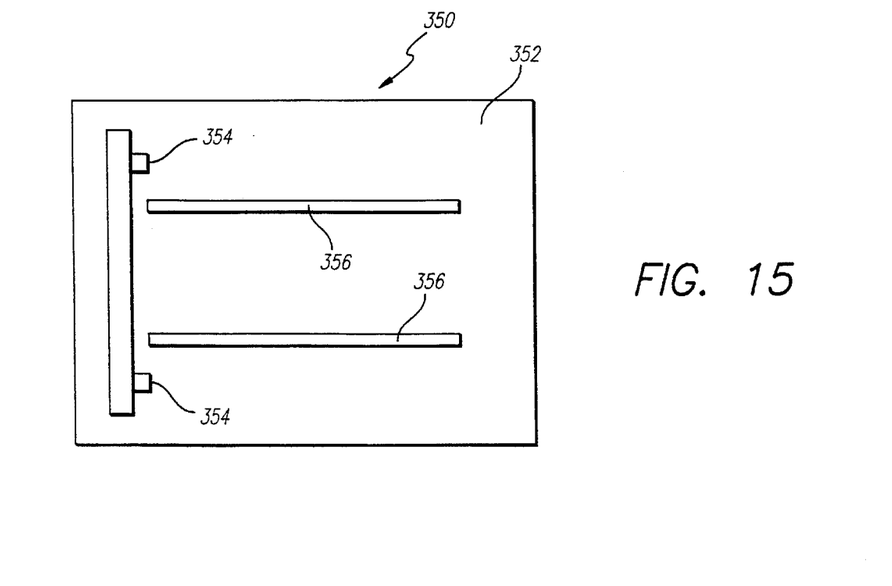
FIG. 15 is a top plan view of a docking station for receiving and operation of the scanning probe microscope, specimen stage, first translating means, and mounting assembly of the invention.

In a preferred embodiment, the scanning probe microscope apparatus for use with a scanning electron microscope also includes an independent docking station 350, illustrated in FIG. 15. The docking station preferably includes a base 352 for receiving the SPM group, with either a pair of front or rear base electrical couplings 354 adapted to receive the corresponding front or rear SPM group electrical couplings, for operation of the scanning probe microscope by an external control unit (not shown). The external docking station can also include tracks 356 disposed on the base, and a mass plate vibration isolation system for stabilizing the base, like that disposed in the vacuum chamber of the scanning electron microscope, although the docking station can simply be placed or mounted on another stand-alone vibration isolation system, as desired.

It will be apparent from the foregoing that while particular forms of the invention have been illustrated and described, various modifications can be made without departing from the spirit and scope of the invention. Accordingly, it is not intended that the invention be limited, except as by the appended claims.

What is claimed is:

1. A scanning probe microscope translation apparatus for use with a scanning probe microscope in combination with a scanning electron microscope, said scanning electron microscope having a specimen vacuum chamber with an access opening for said specimen vacuum chamber, said scanning probe microscope translation apparatus comprising:

a cover plate for sealing said access opening of said scanning electron microscope specimen vacuum chamber, said cover plate having an inside surface and an outside surface, and including a sealable opening therethrough;

a support frame mounted to said inside surface of said cover plate of said specimen vacuum chamber;

translating means for translating said scanning probe microscope relative to said scanning electron microscope;

a mounting assembly disposed on said translating means for mounting the scanning probe microscope at a selected angle with respect to the scanning electron microscope; and vacuum load lock means disposed on said outside surface of said cover plate for moving said mounting assembly and said scanning probe microscope through said sealable opening of said cover plate between a first position disposed within said support frame and a second position disposed in said vacuum load lock means without breaking a vacuum in said vacuum chamber.

2. The apparatus of claim 1, further comprising mass plate means for isolating said scanning probe microscope from external vibrations and supporting said translating means; and suspension means for suspending said mass plate means from said support frame.

3. The apparatus of claim 2, wherein said mounting assembly further comprises first positioning means for positioning and aligning said scanning probe microscope relative to said translating means.

4. The apparatus of claim 3, further including means for translating a specimen stage relative to said scanning probe microscope, control means for controlling said first positioning means, and wherein said mounting assembly comprises a mounting cradle for receiving said scanning probe microscope, said mounting cradle having at least one front electrical coupling secured to a front end of said mounting cradle and at least one rear electrical coupling on a rear end of said mounting cradle, at least one front electrical coupling secured to said vacuum load lock means for receiving said mounting cradle electrical coupling and at least one rear electrical coupling disposed on said mass plate means for receiving said mounting cradle rear electrical coupling, said front and rear mounting cradle electrical couplings being electrically connected to said means for translating said specimen stage relative to said scanning probe microscope, and said front load lock electrical coupling and said rear mass plate electrical coupling being electrically connected to said control means, whereby the first positioning means is connected to said control means in said first position and said second position.

5. The apparatus of claim 3, further comprising a docking station for said mounting assembly, said first positioning means, and said scanning probe microscope.

6. The apparatus of claim 5, wherein said docking station comprises a base for receiving said mounting assembly, and a pair of electrical couplings adapted to receive a corresponding pair of electrical couplings on said mounting assembly for operation of said scanning probe microscope.

7. The apparatus of claim 2, wherein said mass plate means comprises a top mass plate, a bottom mass plate, and support means for supporting said top mass plate on the bottom mass plate.

8. The apparatus of claim 7, wherein said mass plate means comprises second positioning means for aligning and positioning said top mass plate relative to said bottom mass plate.

9. The apparatus of claim 8, wherein said second positioning means comprises a first positioning screw disposed in said bottom mass plate and extending to the bottom surface of said top mass plate, means for driving said first positioning screw, a plurality of secondary positioning screws disposed in said bottom mass plate and extending to the bottom surface of said top mass plate, said first and secondary positioning screws including a sprocket, and said plurality of secondary positioning screws being commonly driven by said first positioning screw by a chain engaging said sprockets of said first and secondary positioning screws, whereby said top mass plate can be uniformly raised or lowered by driving said first positioning screw.

10. The apparatus of claim 7, wherein said suspension means comprises a plurality of o-rings connecting said bottom mass plate and said support frame.

11. The apparatus of claim 2, wherein said suspension means comprises third positioning means for aligning and positioning said mass plate means relative to said support frame.

12. The apparatus of claim 2, further comprising means for clamping said mass plate means.

13. The apparatus of claim 12, wherein said means for clamping comprises first and second clamping members disposed on opposite sides of said mass plate means, gear means connected to said first and second clamping members for simultaneously and synchronously driving said first and second clamping members into and out of engagement with said mass plate means, drive shaft means connected to said gear means for actuating said gear means, and clamp control means connected to said drive shaft for driving said drive shaft.

14. The apparatus of claim 1, wherein said vacuum load lock means comprises a gate valve associated with said opening in said cover plate for sealing and unsealing said opening in said cover plate, said gate valve being moveable between an open position moved away from and unsealing said cover plate opening and a closed position covering and sealing said cover plate opening.

15. The apparatus of claim 14, further including means for moving said gate valve between said open and closed positions.

16. The apparatus of claim 1, wherein said vacuum load lock means comprises a load lock module housing defining a load lock chamber, and further comprising means for equalizing pressure in said load lock chamber with said vacuum in said scanning electron microscope vacuum chamber.

17. The apparatus of claim 1, wherein said load lock chamber comprises a means for equalizing pressure in said load lock chamber with one of said vacuum in said vacuum chamber and atmospheric pressure.

18. The apparatus of claim 17, wherein said means for equalizing pressure comprises a vacuum port connectable with a source of vacuum, a vent port in communication with the atmosphere, and a valve switchable to a first position connecting said load lock chamber in fluid communication with said vacuum port and a second position connecting said load lock chamber with said vent port.

19. The apparatus of claim 1, wherein said vacuum load lock means comprises a base, a housing defining a load lock chamber, said housing including a separable front section slidably mounted on said base and movable between a closed position in which said load lock chamber is sealed, and an open position in which said load lock chamber is open to provide access to the interior of the load lock chamber.

20. The apparatus of claim 19, wherein said separable front section comprises a viewing window.

21. The apparatus of claim 1, further comprising means for moving said mounting assembly and said scanning probe microscope through said cover plate opening between said first position disposed within said support frame in said vacuum chamber and said second position disposed in said vacuum load lock means.

22. The apparatus of claim 21, wherein said mounting assembly has a surface defining a threaded aperture, said vacuum load lock means comprises a housing defining a load lock chamber, and said means for moving said mounting assembly and said scanning probe microscope through said cover plate opening comprises a rod slidably mounted in said lock load means housing and extending from a position outside said load lock chamber to within said load lock chamber, said rod having a threaded end engagable with said mounting assembly threaded aperture, whereby said rod can be slidably extended through the gate valve to be attached to a mounting cradle, for withdrawal of the mounting assembly and scanning probe microscope, and for returning the mounting assembly and scanning probe microscope to the vacuum chamber of the scanning electron microscope.

23. The apparatus of claim 1, further including a first pair of low friction tracks secured to said translating means, and wherein said mounting assembly is slidably disposed on said low friction tracks for translating said mounting assembly and said scanning probe microscope relative to the scanning electron microscope.

24. The apparatus of claim 23, further including a second pair of low friction tracks disposed in said vacuum load lock means aligned with said first pair of low friction tracks, for slidably translating said mounting assembly and said scanning probe microscope between said first and second positions through said cover plate opening.

* * * * *